United States Patent
Yuan et al.

(10) Patent No.: US 9,917,205 B2
(45) Date of Patent: Mar. 13, 2018

(54) OXIDE SEMICONDUCTOR THIN FILM, THIN FILM TRANSISTOR, MANUFACTURING METHOD AND DEVICE

(71) Applicants: BOE TECHNOLOGY GROUP CO., LTD., Beijing (CN); SOUTH CHINA UNIVERSITY OF TECHNOLOGY, Guangzhou, Guangdong (CN)

(72) Inventors: Guangcai Yuan, Beijing (CN); Liangchen Yan, Beijing (CN); Xiaoguang Xu, Beijing (CN); Lei Wang, Beijing (CN); Junbiao Peng, Beijing (CN); Linfeng Lan, Beijing (CN)

(73) Assignees: BOE TECHNOLOGY GROUP CO., LTD., Beijing (CN); SOUTH CHINA UNIVERSITY OF TECHNOLOGY, Guangzhou, Guangdong (CN)

( * ) Notice: Subject to any disclaimer, the term of this patent is extended or adjusted under 35 U.S.C. 154(b) by 0 days.

(21) Appl. No.: 15/123,177

(22) PCT Filed: Sep. 2, 2015

(86) PCT No.: PCT/CN2015/088853
§ 371 (c)(1),
(2) Date: Sep. 1, 2016

(87) PCT Pub. No.: WO2016/173170
PCT Pub. Date: Nov. 3, 2016

(65) Prior Publication Data
US 2017/0077307 A1 Mar. 16, 2017

(30) Foreign Application Priority Data
Apr. 30, 2015 (CN) .......................... 2015 1 0220082

(51) Int. Cl.
*H01L 21/02* (2006.01)
*H01L 29/786* (2006.01)
(Continued)

(52) U.S. Cl.
CPC .......... *H01L 29/7869* (2013.01); *H01L 21/02* (2013.01); *H01L 21/02189* (2013.01);
(Continued)

(58) Field of Classification Search
CPC ......... H01L 21/02365; H01L 21/02518; H01L 21/70; H01L 21/71
See application file for complete search history.

(56) References Cited

U.S. PATENT DOCUMENTS

2005/0019695 A1  1/2005  Kojima et al.
2009/0194766 A1*  8/2009  Park ................... H01L 29/7869
                                                          257/43
(Continued)

FOREIGN PATENT DOCUMENTS

CN        1577549 A        2/2005
CN        101796214 A      8/2010
(Continued)

OTHER PUBLICATIONS

First Office Action regarding Chinese Application No. 201510220082.5, dated Jul. 4, 2017. Translation provided by Dragon Intellectual Property Law Firm.
(Continued)

*Primary Examiner* — Cheung Lee
(74) *Attorney, Agent, or Firm* — Harness, Dickey & Pierce, P.L.C.

(57) ABSTRACT

This disclosure discloses an oxide semiconductor thin film, a thin film transistor, a manufacturing method and a device, belonging to the field of flat panel display. The oxide semiconductor thin film is made of an oxide containing zirconium and indium. A method of manufacturing the oxide semiconductor thin film comprises preparing a target using the oxide containing zirconium and indium, and sputtering the target to obtain the oxide semiconductor thin film.

18 Claims, 4 Drawing Sheets

(51) Int. Cl.
  *H01L 21/34* (2006.01)
  *H01L 29/24* (2006.01)
  *H01L 27/12* (2006.01)
  *H01L 29/66* (2006.01)

(52) U.S. Cl.
  CPC .. *H01L 21/02194* (2013.01); *H01L 21/02565* (2013.01); *H01L 21/34* (2013.01); *H01L 27/1225* (2013.01); *H01L 29/24* (2013.01); *H01L 29/66969* (2013.01); *H01L 29/78696* (2013.01)

(56) References Cited

U.S. PATENT DOCUMENTS

2010/0206725 A1  8/2010  Zhang et al.
2013/0082262 A1*  4/2013  Honda ................ H01L 29/7869
                                                        257/57
2015/0041769 A1*  2/2015  Kim .................... H01L 51/0097
                                                        257/40

FOREIGN PATENT DOCUMENTS

CN       103094352 A       5/2013
TW       201434788 A       9/2014
WO       WO-2014-073210 A1  5/2014

OTHER PUBLICATIONS

Written Opinion of the International Searching Authority and International Search Report for International Application No. PCT/CN2015/088853, dated Feb. 15, 2016. Translation provided by Dragon Intellectual Property Law Firm.
Qadri, S. B. et al., "Indium-doped transparent conducting oxides of $ZrO_2$", Surface and Coatings Technology, 100-101 (1998) 94-97.
Park, Jin-Seong et al., "Novel ZrInZnO Thin-film Transistor with Excellent Stability", Advanced Materials, (2009), 21, 329-333.

* cited by examiner

OXIDE SEMICONDUCTOR THIN FILM, THIN FILM TRANSISTOR, MANUFACTURING METHOD AND DEVICE

CROSS-REFERENCE TO RELATED APPLICATIONS

This application claims is the U.S. national phase of PCT Application No. PCT/CN2015/088853 filed on Sep. 2, 2015, which claims priority to Chinese Patent Application No. 201510220082.5 filed on Apr. 30, 2015, the disclosures of which are incorporated in their entirety by reference herein.

TECHNICAL FIELD

The present disclosure relates to the field of flat panel display, in particular to an oxide semiconductor thin film, a thin film transistor, a manufacturing method and a device.

BACKGROUND

In recent years, thin film transistors are widely used in the field of flat panel display, especially in the field of organic light-emitting display (OLED).

At present, a thin film transistor consists of a gate electrode, an insulating layer, an active layer, a source electrode, a drain electrode, and the like. The active layer is mainly made of a silicon material, which may be, for example, an amorphous silicon.

In the process of carrying out the present disclosure, inventors found that there exists the following problem in the prior art: since the silicon material has shortcomings such as low mobility, a thin film transistor manufactured using the same also has the shortcoming of low mobility.

SUMMARY

In view of the above, an object of the present disclosure is to provide an oxide semiconductor thin film, a thin film transistor, a manufacturing method and a device, capable of improving the mobility of the thin film transistor.

In order to achieve said object, an embodiment according to the present disclosure provides an oxide semiconductor thin film which is made of an oxide containing zirconium and indium.

In one embodiment, the oxide may be, for example, zirconium indium oxide.

Typically, zirconium indium oxide is represented by a chemical formula of, for example, $Zr_xIn_{1-x}O_\delta$ where x is greater than or equal to 0.001 and less than or equal to 0.35, and $\delta$ is greater than 0.

In another embodiment, the oxide may be a mixture composed of zirconium oxide and indium oxide, with a ratio of zirconium oxide to indium oxide being a preset ratio.

In further another embodiment, the oxide semiconductor thin film has a thickness, for example, between 10 nm and 200 nm.

Typically, the oxide semiconductor thin film may have a thickness between 15 nm and 100 nm.

In further another embodiment, the oxide semiconductor thin film has carriers at a concentration, for example, between $1\times10^{15}$ $cm^{-3}$ and $5\times10^{19}$ $cm^{-3}$.

Typically, the oxide semiconductor thin film may have carriers at a concentration, for example, between $1\times10^{16}$ $cm^{-3}$ and $1\times10^{18}$ $cm^{-3}$.

According to an embodiment of the present disclosure, the higher the content of zirconium in the oxide semiconductor thin film is, the lower the concentration of the carriers in the oxide semiconductor thin film is.

In one embodiment, the oxide semiconductor thin film may be annealed at a temperature between 150 degrees Celsius and 500 degrees Celsius.

In another embodiment, the oxide semiconductor thin film is etched with an acidic solution at a rate less than 200 nm/min.

Typically, the oxide semiconductor thin film may be etched with an acidic solution at a rate less than 100 nm/min.

In further another embodiment, the oxide semiconductor thin film has an optical band gap, for example, between 3.4 eV and 4.2 eV.

An embodiment according to the present disclosure provides a method of manufacturing an oxide semiconductor thin film, which comprises:

preparing a target using the oxide containing zirconium and indium; and sputtering the target to obtain the oxide semiconductor thin film.

In one embodiment, prior to preparing a target using the oxide containing zirconium and indium, the method further comprises introducing a reactive gas into the oxide containing zirconium and indium so that a redox reaction between a metal oxide in a lower valence state and the reactive gas occurs to form a metal oxide in a higher valence state.

An embodiment according to the present disclosure provides a thin film transistor whose active layer is made of an oxide semiconductor thin film made of an oxide containing zirconium and indium.

In one embodiment, the active layer has a thickness, for example, between 10 nm and 200 nm.

An embodiment according to the present disclosure provides a method of manufacturing a thin film transistor, which comprises:

forming a gate electrode on a substrate by patterning;

treating an oxide semiconductor thin film on the gate electrode in a preset treatment manner to obtain an active layer, the oxide semiconductor thin film being made of an oxide containing zirconium and indium; and forming a source electrode and a drain electrode on the active layer by patterning.

An embodiment according to the present disclosure provides a display panel comprising a thin film transistor wherein an active layer of the thin film transistor is made of an oxide semiconductor thin film that is made of an oxide containing zirconium and indium.

An embodiment according to the present disclosure provides a display device comprising the display panel.

The embodiments of the present disclosure achieve advantageous technical effects as follows: since the oxide semiconductor thin film is made of the oxide containing zirconium and indium in the above-mentioned technical solutions, the oxide semiconductor thin film contains zirconium and indium. Furthermore, the oxide semiconductor thin film does not contain zinc. Therefore, the oxide semiconductor thin film has advantages of high mobility, wide optical band gap, good acid resistance, etc.

DETAILED DESCRIPTION

Figure 1:
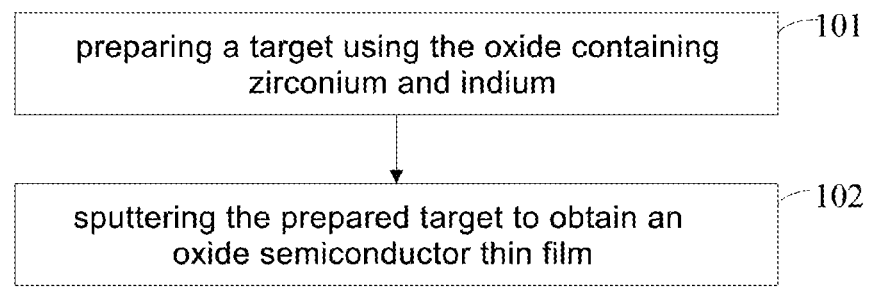
FIG. 1 is a flow chart of a method of manufacturing an oxide semiconductor thin film provided in Embodiment 2 of the present disclosure.

In order to make the object, technical solutions and advantages of the present disclosure more clear, embodiments of the present disclosure are further described in detail in conjunction with the drawings. The following embodiments are not intended to limit the scope of the present disclosure.

Embodiment 1

This embodiment provides an oxide semiconductor thin film which can be used for manufacturing an active layer and the like of a TFT.

The oxide semiconductor thin film of this embodiment is made of an oxide containing zirconium and indium. It is to be stressed that the oxide semiconductor thin film of this embodiment does not contain zinc.

Since the oxide semiconductor thin film of this embodiment is made of the oxide containing zirconium and indium, the oxide semiconductor thin film contains zirconium and indium. Furthermore, the oxide semiconductor thin film does not contain zinc. Therefore, the oxide semiconductor thin film has advantages of high mobility, wide optical band gap, good acid resistance, etc.

Optionally, the oxide containing zirconium and indium may be zirconium indium oxide which is one substance rather than a mixture of several substances. Therefore, the oxide semiconductor thin film made of zirconium indium oxide has high stability.

Typically, zirconium indium oxide may be represented by a chemical formula of $Zr_xIn_{1-x}O_\delta$ where x is greater than or equal to 0.001 and less than or equal to 0.35, and 6 is greater than 0. For example, it may be $ZrIn_2O_5$, $Zr_2In_4O_{10}$ or the like.

Optionally, the oxide containing zirconium and indium may be a mixture composed of zirconium oxide and indium oxide, with a ratio of zirconium oxide to indium oxide in the mixture being a preset ratio.

Typically, the chemical formula of zirconium oxide may be, for example, $ZrO_2$, $Zr_2O_4$, $Zr_4O_8$, $Zr_8O_{16}$ or the like. The chemical formula of indium oxide may be, for example, $In_2O_3$, $In_4O_6$, $In_8O_{12}$, $In_{16}O_{24}$ or the like. The preset ratio may be, for example, 1:1, 1:2, 1:3 or the like. However, these are merely examples of zirconium oxide, indium oxide and the preset ratio, and not intended to limit the protection scope of the present disclosure.

In addition, it shall be indicated that, the oxide semiconductor thin film of this embodiment contains zirconium which has relatively low electronegativity and can inhibit the generation of oxygen vacancy in the oxide semiconductor thin film, thus the concentration of carriers in the oxide semiconductor thin film can be controlled. Furthermore, zirconium oxide is poorly soluble in water as well as in a solution of such as hydrochloric acid or dilute sulphuric acid. Hence, when zirconium oxide is added to the oxide semiconductor thin film, the acid resistance of the oxide semiconductor thin film can be enhanced.

There are many crystal phases for zirconium oxide, and phase transition between different crystal phases may cause significant change in volume. In this embodiment, in addition to zirconium oxide, indium oxide is added to the oxide semiconductor thin film. Indium oxide facilitates the stabilization of the crystal phase of zirconium oxide, which can prevent local crack and change in electrical property of the oxide semiconductor thin film due to the phase transition between different crystal phases of zirconium oxide, and thus can improve the mobility and stability of the oxide semiconductor thin film.

It shall be indicated that, when preparing a TFT, it is necessary to perform a passivation treatment on the TFT. In this embodiment, both zirconium indium oxide and a mixture of zirconium oxide and indium oxide which are used for manufacturing the oxide semiconductor thin film are insensitive to water and oxygen in the air. Therefore, the TFT manufactured using the oxide semiconductor thin film provided in this embodiment will be insensitive to the material of a passivation layer, and can be directly passivated using an insulating material such as polymer or photoresist so as to reduce the cost of the process.

Optionally, the oxide semiconductor thin film of this embodiment has a thickness, for example, between 10 nm and 200 nm. When a TFT is manufactured using the oxide semiconductor thin film having such a thickness, its active layer has relatively high stability.

Typically, the oxide semiconductor thin film of this embodiment may have a thickness between 15 nm and 100 nm. When a TFT is manufactured using the oxide semiconductor thin film having such a thickness, its active layer will have higher stability.

Optionally, the oxide semiconductor thin film of this embodiment has carriers at a concentration for example, between $1\times10^{15}$ cm$^{-3}$ and $5\times10^{19}$ cm$^{-3}$, which can ensure that the oxide semiconductor thin film has characteristics of a semiconductor.

Typically, the oxide semiconductor thin film of this embodiment may have carriers at a concentration between $1\times10^{16}$ cm$^{-3}$ and $1\times10^{18}$ cm$^{-3}$. When having carriers at such a concentration, the oxide semiconductor thin film has the strongest semiconductor characteristics.

It shall be indicated that, the higher the content of zirconium in the oxide semiconductor thin film is, the lower the concentration of the carriers in the oxide semiconductor thin film is. Therefore, it is possible to adjust the concentration of the carriers in the oxide semiconductor thin film by controlling the content of zirconium in the oxide semiconductor thin film.

Optionally, the oxide semiconductor thin film of this embodiment is annealed at a temperature, for example, between 150 degrees Celsius and 500 degrees Celsius. When the annealing temperature is between 150 degrees Celsius and 500 degrees Celsius, the thin film property of the oxide semiconductor thin film can be effectively improved.

Optionally, the oxide semiconductor thin film of this embodiment is etched with an acidic solution at a rate less than 200 nm/min. For example, in case of using 5% hydrochloric acid, the oxide semiconductor thin film is etched at a rate less than 200 nm/min. Typically, the oxide semiconductor thin film of this embodiment may be etched with an acidic solution at a rate less than 100 nm/min. For example, in case of using 5% hydrochloric acid, the oxide semiconductor thin film is etched at a rate less than 100 nm/min.

Optionally, the oxide semiconductor thin film of this embodiment has an optical band gap, for example, between 3.4 eV and 4.2 eV.

In this embodiment, since the oxide semiconductor thin film is made of the oxide containing zirconium and indium, the oxide semiconductor thin film contains zirconium and indium. Furthermore, the oxide semiconductor thin film does not contain zinc. Therefore, the oxide semiconductor thin film has advantages of high mobility, wide optical band gap, good acid resistance, etc.

Embodiment 2

This embodiment provides a method of manufacturing an oxide semiconductor thin film. This method can be used for manufacturing any of the oxide semiconductor thin films provided in Embodiment 1. FIG. 1 is a flow chart of a method of manufacturing an oxide semiconductor thin film provided in this embodiment. Referring to FIG. 1, the manufacturing method of this embodiment comprises:

step 101: preparing a target using an oxide containing zirconium and indium.

In step 101, the oxide may be zirconium indium oxide or a mixture of zirconium oxide and indium oxide, with a ratio of zirconium oxide to indium oxide being a preset ratio.

In this embodiment, zirconium indium oxide can be used as the target material. An oxide semiconductor thin film made of zirconium indium oxide has high stability. Zirconium indium oxide may be represented by a chemical formula of $Zr_xIn_{1-x}O_\delta$ where x is greater than or equal to 0.001 and less than or equal to 0.35, and $\delta$ is greater than 0. For example, it may be $ZrIn_2O_5$, $Zr_2In_4O_{10}$ or the like.

In this embodiment, the mixture composed of zirconium oxide and indium oxide may be used as the target material. Zirconium oxide contains zirconium which has relatively low electronegativity and can inhibit the generation of oxygen vacancy in the oxide semiconductor thin film, thus the concentration of carriers in the oxide semiconductor thin film can be controlled. Furthermore, zirconium oxide is poorly soluble in water as well as in a solution of such as hydrochloric acid or dilute sulphuric acid. Hence, when zirconium oxide is added to the oxide semiconductor thin film, the acid resistance of the oxide semiconductor thin film can be enhanced.

There are many crystal phases for zirconium oxide, and phase transition between different crystal phases may cause significant change in volume. In this embodiment, when manufacturing the oxide semiconductor thin film, in addition to zirconium oxide, indium oxide is added thereto. Indium oxide facilitates the stabilization of the crystal phase of zirconium oxide, which can prevent local crack and change in electrical property of the oxide semiconductor thin film due to the phase transition between different crystal phases of zirconium oxide, and thus can improve the mobility and stability of the oxide semiconductor thin film.

Step 102: sputtering the prepared target to obtain the oxide semiconductor thin film.

Optionally, in this embodiment, the oxide semiconductor thin film has a thickness, for example, between 10 nm and 200 nm. When a TFT is manufactured using the oxide semiconductor thin film having such a thickness, its active layer has relatively high stability.

Typically, in this embodiment, the oxide semiconductor thin film may have a thickness between 15 nm and 100 nm. When a TFT is manufactured using the oxide semiconductor thin film having such a thickness, its active layer will have higher stability.

Optionally, in this embodiment, the oxide semiconductor thin film has carriers at a concentration for example, between $1\times10^{15}$ $cm^{-3}$ and $5\times10^{19}$ $cm^{-3}$, which can ensure that the oxide semiconductor thin film has characteristics of a semiconductor.

Typically, in this embodiment, the oxide semiconductor thin film may have carriers at a concentration between $1\times10^{16}$ $cm^{-3}$ and $1\times10^{18}$ $cm^{-3}$. When having carriers at such a concentration, the oxide semiconductor thin film has the strongest semiconductor characteristics.

It shall be indicated that, the higher the content of zirconium in the oxide semiconductor thin film is, the lower the concentration of the carriers in the oxide semiconductor thin film is. Therefore, it is possible to adjust the concentration of the carriers in the oxide semiconductor thin film by controlling the content of zirconium in the oxide semiconductor thin film.

Optionally, in this embodiment, the oxide semiconductor thin film is annealed at a temperature, for example, between 150 degrees Celsius and 500 degrees Celsius. When the annealing temperature is between 150 degrees Celsius and 500 degrees Celsius, the thin film property of the oxide semiconductor thin film can be effectively improved.

Optionally, in this embodiment, the oxide semiconductor thin film is etched with an acidic solution at a rate less than 200 nm/min. For example, in case of using 5% hydrochloric acid, the oxide semiconductor thin film is etched at a rate less than 200 nm/min. Typically, the oxide semiconductor thin film may be etched with an acidic solution at a rate smaller than 100 nm/min. For example, in case of using 5% hydrochloric acid, the oxide semiconductor thin film is etched at a rate less than 100 nm/min.

Optionally, in this embodiment, the oxide semiconductor thin film has an optical band gap, for example, between 3.4 eV and 4.2 eV.

Further, according to this embodiment, a reactive gas may be introduced into the oxide containing zirconium and indium prior to step 101 so that a redox reaction between a metal oxide in a lower valence state and the reactive gas occurs, so as to form a metal oxide in a higher valence state.

The reactive gas may be oxygen, etc. According to this embodiment, the metal oxide in the higher valence state is more stable than the metal oxide in the lower valence state.

In this embodiment, the target is prepared using the oxide containing zirconium and indium, and then sputtered to obtain an oxide semiconductor thin film. Since the oxide semiconductor thin film is made of the oxide containing zirconium and indium, the oxide semiconductor thin film contains zirconium and indium. Furthermore, the oxide semiconductor thin film does not contain zinc. Therefore, the oxide semiconductor thin film has advantages of high mobility, wide optical band gap, good acid resistance, etc.

Embodiment 3

This embodiment provides a TFT whose active layer is made of an oxide semiconductor thin film made of an oxide containing zirconium and indium. The oxide semiconductor thin film may be any of the oxide semiconductor thin films mentioned above.

Figure 2:
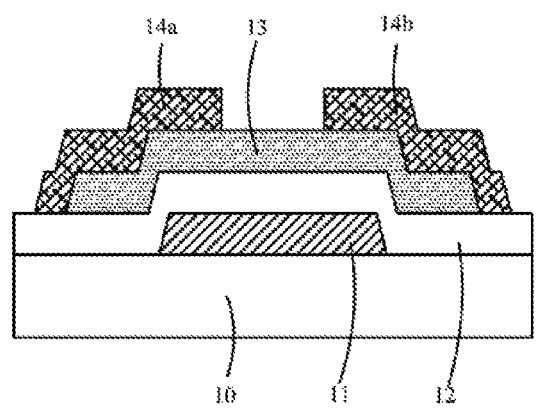
FIG. 2 is a structural schematic diagram of a thin film transistor provided in Embodiment 3 of the present disclosure.

FIG. 2 is a structural schematic diagram of the TFT provided in this embodiment. Referring to FIG. 2, the TFT provided in this embodiment may be a bottom-gate top-contact structure. The TFT comprises a substrate 10, a gate electrode lion the substrate 10, an insulating layer 12 located on the gate electrode 11 and the substrate 10, an active layer 13 which covers an upper surface of the insulating layer 12 and which is located at a position corresponding to the gate electrode 11, and a source electrode 14a and a drain electrode 14b spaced from each other and electrically connected to two ends of the active layer 13.

In this embodiment, the active layer has a thickness, for example, between 10 nm and 200 nm.

The substrate 10 may be one of glass, silicon wafer, foil, quartz and other base substrate materials, and may further comprise a buffer layer, a water and oxygen barrier layer, etc covering the base substrate.

The gate electrode 11 may be made of an electrically conductive material, such as metal, alloy, electrically conductive metallic oxide, or the like, or formed by stacking two or more thin films made of any combination of the materials mentioned above.

The insulating layer 12 may be a single-layered thin film made of an insulating material for a semiconductor device, such as silicon dioxide, silicon nitride, silicon oxynitride, aluminium oxide, aluminium oxide alloy, ytterbium oxide, titanium oxide, hafnium oxide, tantalum oxide, zirconium oxide, etc, or formed by stacking two or more thin films made of any combination of the materials mentioned above.

The source electrode 14a and the drain electrode 14b may be made of a single-layered thin film of an electrically conductive material, such as metal, alloy, electrically conductive metallic oxide, electrically conductive polymer, etc, or formed by stacking two or more thin films made of any combination of the materials mentioned above.

In this embodiment, the active layer of the thin film transistor is made of the oxide semiconductor thin film which is made of an oxide containing zirconium and indium, thus the oxide semiconductor thin film contains zirconium and indium. Furthermore, the oxide semiconductor thin film does not contain zinc. Therefore, the oxide semiconductor thin film has advantages of high mobility, wide optical band gap, good acid resistance, etc.

Embodiment 4

Figure 3:
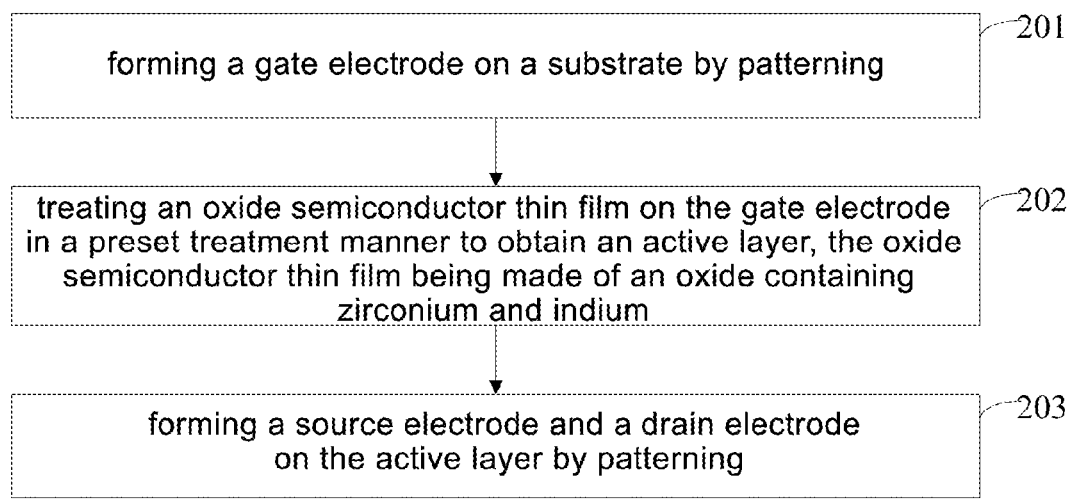
FIG. 3 is a flow chart of a method of manufacturing a thin film transistor provided in Embodiment 4 of the present disclosure.

This embodiment provides a method of manufacturing a thin film transistor. FIG. 3 is a flow chart of a method of manufacturing the thin film transistor provided in this embodiment. Referring to FIG. 3, the manufacturing method of this embodiment comprises:

step 201: forming a gate electrode on a substrate by patterning;

step 202: treating an oxide semiconductor thin film on the gate electrode in a preset treatment manner to obtain an active layer, the oxide semiconductor thin film being made of an oxide containing zirconium and indium; and step 203: forming a source electrode and a drain electrode on the active layer by patterning.

Optionally, the manufacturing method of this embodiment may be realized through the following methods:

First method: preparing one or more electrically conductive thin films having a thickness of 100 to 500 nm on a substrate by sputtering, and obtaining a gate electrode by a patterning process using a mask or photoetching method; obtaining an insulating layer on the gate electrode by patterning, placing an oxide semiconductor thin film on the insulating layer, treating the oxide semiconductor thin film through co-sputtering or direct sputtering to form an active layer having a thickness, for example, between 10 nm and 200 nm; then, preparing one or more electrically conductive thin films having a thickness of 100 to 1000 nm on the active layer through vacuum evaporation or sputtering, and obtaining a source electrode and a drain electrode at the same time by a patterning process using a mask or photoetching method.

Optionally, the operation of obtaining the insulating layer on the gate electrode by patterning may be: obtaining the insulating layer on the gate electrode by a patterning process by means of anodic oxidation, thermal oxidization, physical vapor deposition or chemical vapor deposition; or obtaining the insulating layer on the gate electrode by a patterning process using a mask or photoetching method. The resulting insulating layer has a thickness of, for example, 100 to 1000 nm.

In the thin film transistor obtained through the above method, since the oxide semiconductor thin film as the active layer can effectively control the number of the oxygen vacancies, thus surplus carriers can be inhibited, and the mobility can be also improved in the meantime.

Since the material of the oxide semiconductor thin film in this embodiment is insensitive to water and oxygen in the air, hysteresis between curves of forward and backward transfer characteristics of the thin film transistor unprotected by a passivation layer and based on the oxide semiconductor thin film material of this embodiment is small. Meanwhile, the thin film transistor of this embodiment is insensitive to the material of the passivation layer, and can be directly passivated using an insulating material, polymer or photoresist, which reduces the cost of the process.

Second method: firstly, preparing an Al—Nd alloy thin film having a thickness of 300 nm on a glass substrate by sputtering, and obtaining a gate electrode by a patterning process using a photoetching method; next, preparing an insulating layer using an anodic oxidation method to form a gate oxide layer having a thickness of 200 nm; then, forming an active layer which is made of $Zr_xIn_{1-x}O_\delta$ where x is equal to 0.001. The active layer is prepared by a single target sputtering process, which comprises preparing a target using two raw materials $In_2O_3$ and $ZrO_2$ in a certain ratio, and installing the target on a sputtering apparatus to be sputtered to form an active layer having a thickness of 20 nm. Then, the active layer is annealed at 150 degrees Celsius for half an hour, a layer of Al having a thickness of 300 nm is prepared on the active layer using a sputtering process, and a source electrode and a drain electrode are formed by a patterning process using a mask.

Figure 4:
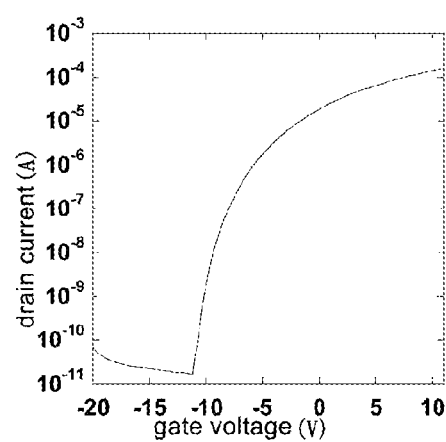
FIG. 4 is a graph of transfer characteristic of the thin film transistor provided using the second method of Embodiment 4 of the present disclosure.

FIG. 4 shows a graph of transfer characteristic of the thin film transistor manufactured using the method described above. As can be seen from FIG. 4, the transistor has a turn-on voltage of about −11V, and very high carrier mobility of 38.4 $cm^2/Vs$, which indicates the thin film transistor of this embodiment has less defects. Moreover, the thin film transistor in which the active layer is made of pure $In_2O_3$ exhibits high conductivity, which indicates the thin film transistor of this embodiment can effectively inhibit the concentration of surplus carriers.

Third method: firstly, preparing an Al—Nd alloy thin film having a thickness of 300 nm on a glass substrate by sputtering, and obtaining a gate electrode by a patterning process using a photoetching method; next, preparing an insulating layer using an anodic oxidation method to form a gate oxide layer having a thickness of 200 nm; then, forming an active layer which is made of $Zr_xIn_{1-x}O_\delta$ where x is equal to 0.01. The active layer is prepared by a single target sputtering process, which comprises preparing a target using two raw materials $In_2O_3$ and $ZrO_2$ in a certain ratio, and installing the target on a sputtering apparatus to be sputtered to form an active layer having a thickness of 30 nm. Then, the active layer is annealed at 230 degrees Celsius for half an hour, a layer of Al having a thickness of 300 nm is prepared on the active layer using a sputtering process, and a source electrode and a drain electrode are formed by a patterning process using a mask.

Figure 5:
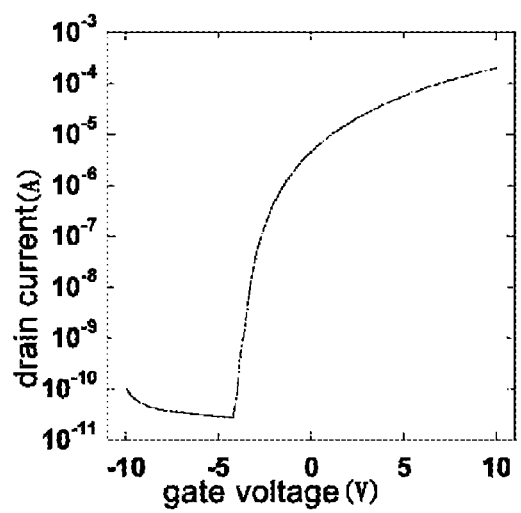
FIG. 5 is a graph of transfer characteristic of the thin film transistor provided using the third method of Embodiment 4 of the present disclosure.

FIG. 5 shows a graph of transfer characteristic of the thin film transistor manufactured using the method described above. As can be seen from FIG. 5, the transistor has a turn-on voltage of about −4V, and higher carrier mobility of 42.1 cm$^2$/Vs, which indicates that appropriately increasing the content of Zr can not only inhibit the concentration of surplus carriers, but also improve the mobility.

Fourth method: firstly, preparing an Al—Nd alloy thin film having a thickness of 300 nm on a glass substrate by sputtering, and obtaining a gate electrode by a patterning process using a photoetching method; next, preparing an insulating layer using an anodic oxidation method to form a gate oxide layer having a thickness of 200 nm; then, forming an active layer which is made of $Zr_xIn_{1-x}O_\delta$ where x is equal to 0.05. The active layer is prepared by a single target sputtering process, which comprises preparing a target using two raw materials $In_2O_3$ and $ZrO_2$ in a certain ratio, and installing the target on a sputtering apparatus to be sputtered to form an active layer having a thickness of 50 nm. Then, the active layer is annealed at 230 degrees Celsius for half an hour, and is etched with 5% hydrochloric acid at an etching rate of about 100 nm/min. A layer of Al having a thickness of 100 nm is prepared on the active layer using a sputtering process, and a source electrode and a drain electrode are formed by a patterning process using a wet-etching method.

Figure 6:
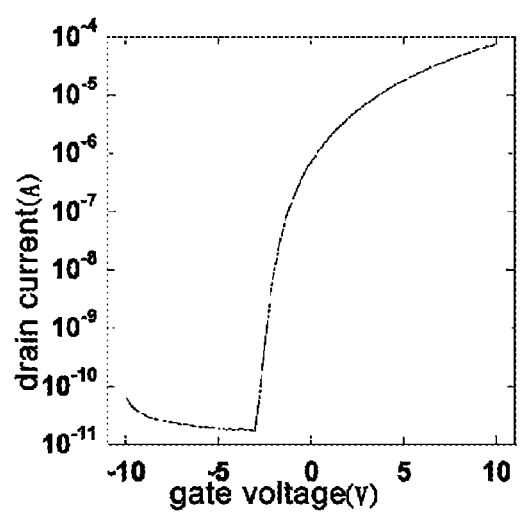
FIG. 6 is a graph of transfer characteristic of the thin film transistor provided using the fourth method of Embodiment 4 of the present disclosure.

FIG. 6 shows a graph of transfer characteristic of the thin film transistor manufactured using the method described above. As can be seen from FIG. 6, the transistor has a turn-on voltage of about −3V, high carrier mobility of 24.1 cm$^2$/Vs and certain anti-etching property, and can realize a back-channel etching structure.

Fifth method: firstly, preparing an Al—Nd alloy thin film having a thickness of 300 nm on a glass substrate by sputtering, and obtaining a gate electrode by a patterning process using a photoetching method; next, preparing an insulating layer using an anodic oxidation method to form a gate oxide layer having a thickness of 200 nm; then, forming an active layer which is made of $Zr_xIn_{1-x}O_\delta$ where x is equal to 0.1. The active layer is prepared by a single target sputtering process, which comprises preparing a target using two raw materials $In_2O_3$ and $ZrO_2$ in a certain ratio, and installing the target on a sputtering apparatus to be sputtered to form an active layer having a thickness of 50 nm. Then, the active layer is annealed at 250 degrees Celsius for half an hour, and is etched with 5% hydrochloric acid at an etching rate of about 60 nm/min. A layer of Al having a thickness of 100 nm is prepared on the active layer using a sputtering process, and a source electrode and a drain electrode are formed by a patterning process using a wet-etching method.

Figure 7:
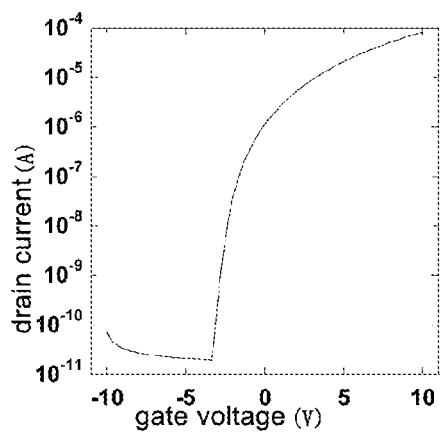
FIG. 7 is a graph of transfer characteristic of the thin film transistor provided using the fifth method of Embodiment 4 of the present disclosure.

FIG. 7 shows a graph of transfer characteristic of the thin film transistor manufactured using the method described above. As can be seen from FIG. 7, the transistor has a turn-on voltage of about −3V, high carrier mobility of 26.3 cm$^2$/Vs and certain anti-etching property, and can realize a back-channel etching structure.

Sixth method: firstly, preparing a Mo thin film having a thickness of 300 nm on a glass substrate by sputtering, and obtaining a gate electrode by a patterning process using a photoetching method; next, preparing a two-layered thin film SiN$_x$ (150 nm)/SiO$_2$ (150 nm) as an insulating layer using a chemical vapor deposition method; then, forming an active layer which is made of $Zr_xIn_{1-x}O_\delta$ where x is equal to 0.3. The active layer is prepared by a single target sputtering process, which comprises preparing a target using two raw materials $In_2O_3$ and $ZrO_2$ in a certain ratio, and installing the target on a sputtering apparatus to be sputtered to form an active layer having a thickness of 50 nm. Then, the active layer is annealed at 450 degrees Celsius for half an hour, and is etched with 5% hydrochloric acid at an etching rate of about 100 nm/min. Stacked layers of Mo/Al/Mo is prepared on the active layer using a sputtering process, and a source electrode and a drain electrode are formed by a patterning process using a wet-etching method. A layer of photoresist is spin-coated on the active layer, the source electrode and the drain electrode as a passivation layer.

Figure 8:
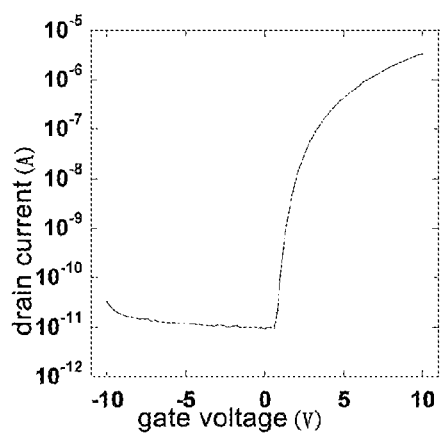
FIG. 8 is a graph of transfer characteristic of the thin film transistor provided using the sixth method of Embodiment 4 of the present disclosure.

FIG. 8 shows a graph of transfer characteristic of the thin film transistor manufactured using the method described above. As can be seen from FIG. 8, the transistor has a turn-on voltage of about −3V, high carrier mobility of 14.2 cm$^2$/Vs and certain anti-etching property, and can realize a back-channel etching structure. Furthermore, a polymer material such as photoresist can be used as a passivation layer for the thin film transistor manufactured using the method described above.

In this embodiment, the active layer of the thin film transistor is prepared using the oxide semiconductor thin film. Since the oxide semiconductor thin film is made of an oxide containing zirconium and indium, the oxide semiconductor thin film contains zirconium and indium. Furthermore, the oxide semiconductor thin film does not contain zinc, the thin film transistor has advantages of high mobility, wide optical band gap, good acid resistance, etc.

Embodiment 5

This embodiment provides a display panel comprising a thin film transistor wherein an active layer of the thin film transistor is made of an oxide semiconductor thin film that is made of an oxide containing zirconium and indium.

In this embodiment, the thin film transistor may be the thin film transistor described in Embodiment 3 or 4. Thus, the oxide semiconductor thin film may be the oxide semiconductor thin film in any of the above-mentioned embodiments.

In this embodiment, the display panel comprises the thin film transistor whose active layer is made of the oxide semiconductor thin film. Since the oxide semiconductor thin film is made of an oxide containing zirconium and indium, the oxide semiconductor thin film contains zirconium and indium. Furthermore, the oxide semiconductor thin film does not contain zinc, the thin film transistor has advantages of high mobility, wide optical band gap, good acid resistance, etc.

Embodiment 6

This embodiment provides a display device comprising the display panel as described in Embodiment 5.

In this embodiment, the display panel in this display device comprises the thin film transistor whose active layer is made of an oxide semiconductor thin film. Since the oxide semiconductor thin film is made of an oxide containing zirconium and indium, the oxide semiconductor thin film contains zirconium and indium. Furthermore, the oxide semiconductor thin film does not contain zinc. Therefore, the thin film transistor has advantages of high mobility, wide optical band gap, good acid resistance, etc, thereby allowing the display device to have such advantages, too.

The foregoing are merely preferable embodiments of the present invention, and not intended to limit the present disclosure. It shall be pointed out that, all modifications, equivalent replacements, improvements, etc. made within the spirit and principle of the present disclosure shall be encompassed in the protection scope of the present disclosure.

What is claimed is:

1. A method of manufacturing an oxide semiconductor thin film, comprising:
    introducing a reactive gas into an oxide containing zirconium and indium so that a redox reaction between a metal oxide in a lower valence state and the reactive gas occurs to form a metal oxide in a higher valence state;
    preparing a target using the oxide containing zirconium and indium; and
    sputtering the target to obtain the oxide semiconductor thin film.

2. The method according to claim 1, wherein the oxide semiconductor thin film is represented by a chemical formula of $Zr_xIn_{1-x}O_\delta$ where x is greater than or equal to 0.001 and less than or equal to 0.35, and $\delta$ is greater than 0.

3. The method according to claim 1, wherein the oxide semiconductor thin film has a thickness between 10 nm and 200 nm.

4. The method according to claim 1, wherein the oxide semiconductor thin film has a thickness between 15 nm and 100 nm.

5. The method according to claim 1, wherein the oxide semiconductor thin film has carriers at a concentration between $1\times10^{15}$ $cm^{-3}$ and $5\times10^{19}$ $cm^{-3}$.

6. The method according to claim 1, wherein the oxide semiconductor thin film is annealed at a temperature between 150 degrees Celsius and 500 degrees Celsius.

7. The method according to claim 1, wherein the oxide semiconductor thin film is etched with an acidic solution at a rate less than 200 nm/min.

8. The method according to claim 1, wherein the oxide semiconductor thin film is etched with an acidic solution at a rate less than 100 nm/min.

9. The method according to claim 1, wherein the oxide semiconductor thin film has an optical band gap between 3.4 eV and 4.2 eV.

10. A method of manufacturing a thin film transistor, comprising:
    forming a gate electrode on a substrate by patterning;
    treating an oxide semiconductor thin film on the gate electrode in a preset treatment manner to obtain an active layer, the oxide semiconductor thin film being made of an oxide containing zirconium and indium; and
    forming a source electrode and a drain electrode on the active layer by patterning,
    wherein the oxide semiconductor thin film is formed by:
        introducing a reactive gas into the oxide containing zirconium and indium so that a redox reaction between a metal oxide in a lower valence state and the reactive gas occurs to form a metal oxide in a higher valence state;
        preparing a target using the oxide containing zirconium and indium; and
        sputtering the target to obtain the oxide semiconductor thin film.

11. The method according to claim 10, wherein the oxide containing zirconium and indium is represented by a chemical formula of $Zr_xIn_{1-x}O_\delta$ where x is greater than or equal to 0.001 and less than or equal to 0.35, and $\delta$ is greater than 0.

12. The method according to claim 10, wherein the oxide semiconductor thin film has a thickness between 10 nm and 200 nm.

13. The method according to claim 10, wherein the oxide semiconductor thin film has a thickness between 15 nm and 100 nm.

14. The method according to claim 10, wherein the oxide semiconductor thin film has carriers at a concentration between $1\times10^{15}$ $cm^{-3}$ and $5\times10^{19}$ $cm^{-3}$.

15. The method according to claim 10, wherein the oxide semiconductor thin film is annealed at a temperature between 150 degrees Celsius and 500 degrees Celsius.

16. The method according to claim 10, wherein the oxide semiconductor thin film is etched with an acidic solution at a rate less than 200 nm/min.

17. The method according to claim 10, wherein the oxide semiconductor thin film is etched with an acidic solution at a rate less than 100 nm/min.

18. The method according to claim 10, wherein the oxide semiconductor thin film has an optical band gap between 3.4 eV and 4.2 eV.

* * * * *